United States Patent
Birth et al.

(10) Patent No.: US 6,826,389 B2
(45) Date of Patent: Nov. 30, 2004

(54) TRANSMITTER AND METHOD OF GENERATING A TRANSMISSION SIGNAL

(75) Inventors: Winfrid Birth, Veitsbronn (DE); Andreas Fröhlich, Wendelstein (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 662 days.

(21) Appl. No.: 09/799,839

(22) Filed: Mar. 5, 2001

(65) Prior Publication Data

US 2001/0034215 A1 Oct. 25, 2001

(30) Foreign Application Priority Data

Mar. 7, 2000 (DE) .......................................... 100 11 061

(51) Int. Cl.$^7$ ................................................ H04B 1/04
(52) U.S. Cl. .................. 455/114.1; 455/323; 455/114.2
(58) Field of Search .......................... 455/102, 47, 109, 455/114.1, 114.3, 115.1, 108, 13.4, 313, 575.1, 550.1, 127.3, 63.1, 118, 112, 119, 126, 91, 561, 323, 318, 315, 317, 295, 296; 332/9 R, 37 R, 41, 45, 48, 170, 151, 145, 152, 163, 167–169, 159; 375/43, 61, 270, 301, 297, 296; 330/149, 151; 331/45; 327/119, 100

(56) References Cited

U.S. PATENT DOCUMENTS

| | | | | |
|---|---|---|---|---|
| 3,486,117 A | * | 12/1969 | Groves et al. | 375/300 |
| 3,710,276 A | * | 1/1973 | Dao | 331/45 |
| 4,019,118 A | * | 4/1977 | Harwood | 363/163 |
| 4,727,596 A | * | 2/1988 | Jaffer | 455/326 |
| 5,172,072 A | * | 12/1992 | Willems et al. | 330/149 |
| 5,455,538 A | * | 10/1995 | Kobayashi et al. | 330/149 |
| 6,108,385 A | * | 8/2000 | Worley, III | 375/296 |
| 6,188,732 B1 | * | 2/2001 | Rha | 375/297 |
| 6,288,610 B1 | * | 9/2001 | Miyashita | 330/149 |

* cited by examiner

Primary Examiner—Edward F. Urban
Assistant Examiner—C. Chow
(74) Attorney, Agent, or Firm—Aaron Waxler

(57) ABSTRACT

The invention relates to a transmitter and a method of generating a transmission signal. A first modulation device 12 generates an uncompensated transmission signal Y(t) by modulating at least one baseband signal I, Q with a respective oscillation signal LOQ, LOI. The invention improves a transmitter with such a modulation device so as to reduce the expenditure for the filtering at a later stage that is necessary to attenuate undesirable components in the uncompensated transmission signal Y(t). This is achieved in that a compensation signal C(t) is formed on the output of a second modulation device (14), the compensation signal representing essentially the components to be compensated in the uncompensated transmission signal Y(t).

9 Claims, 6 Drawing Sheets

A = const for GMSK

US 6,826,389 B2

TRANSMITTER AND METHOD OF GENERATING A TRANSMISSION SIGNAL

Cross-reference to related applications foreign priority benefits are claimed under 35 U.S.C. 119 with respect to German Application No. 10011061.4, filed Mar. 7, 2000.

BACKGROUND OF THE INVENTION

The invention relates to a transmitter, notably a mobile radio transmitter, for generating a transmission signal, which transmitter includes a first modulation device for generating an uncompensated transmission signal by modulation of at least one baseband signal with a respective oscillation signal.

The invention also relates to a method of operating the transmitter.

A transmitter of this kind is known, for example as the integrated circuit PMB 2200 manufactured by Siemens AG. The transmitter includes a modulation device; more exactly speaking, it includes a quadrature modulator as shown in simplified form in FIG. 5.

The quadrature modulator shown in FIG. 5 includes two modulators 52a, 52b, each of which multiplies a respective baseband signal I(t), Q(t) by an associated oscillation signal $X_{LOQ}$, $X_{LOI}$.

The baseband signals I, Q concern Cartesian components of a rotating pointer A as is illustrated in FIG. 6. This Figure shows, by way of example, that the baseband signal I is a cosine oscillation and that the baseband signal Q is a sine oscillation, both oscillations being of equal amplitude A. An amplitude of equal absolute value is specified, for example, in the mobile radio standard GMSK.

The oscillation signals $X_{LOI}$ and $X_{LOQ}$ shown in FIG. 7 are binary switching signals that have been phase shifted 90° relative to one another.

The first modulator 52a in FIG. 5 modulates the baseband signal Q(t) with the first oscillation signal $X_{LOQ}$ and the second modulator 52b modulates the baseband signal I(t) with the oscillation signal $X_{LOI}$. The outputs of the two modulators are additively combined in the addition device 54 so as to form a transmission signal Y(t).

Because the oscillation signals shown in FIG. 7 are binary switching signals, they can be decomposed into a fundamental wave and a plurality of harmonics by way of Fourier transformation. The following expression is then obtained for the oscillation signal $X_{LOI}$:

$$x_{LOI} = \cos\omega_c t - \frac{1}{3}\cos3\omega_c t + \frac{1}{5}\cos5\omega_c t - \frac{1}{7}\cos7\omega_c t \quad (1)$$

and for the oscillation signal $X_{LOQ}$ there is obtained $$x_{LOQ} = \sin\omega_c t + \frac{1}{3}\sin3\omega_c t + \frac{1}{5}\sin5\omega_c t + \frac{1}{7}\sin7\omega_c t \quad (2)$$

Thus, the transmission signal Y(t) at the output of the quadrature modulator shown in FIG. 5 is:

$$y(t) = X_{LOI}(t) \cdot \cos\omega_m t \underset{(-)}{+} X_{LOQ}(t)\sin\omega_m t \quad (3)$$

$$= \cos(\omega_c \underset{(+)}{\mp} \omega_m)t - \frac{1}{3}\cos(3\omega_c(\pm)\omega_m)t + \frac{1}{5}\cos(5\omega_c \underset{(+)}{\mp}\omega_m)t \quad (4)$$

This expression for the transmission signal Y(t) is obtained while taking into account the following equations and addition theorems:

$$Y(t) = A\cos\phi(t)\cdot\cos\omega_c t(\pm)A\sin\phi(t)\cdot\sin\omega_c t \quad (5)$$

$$\cos\alpha\cos\beta = \frac{1}{2}[\cos(\alpha-\beta)+\cos(\alpha+\beta)] \quad (6)$$

$$\sin\alpha\sin\beta = \frac{1}{2}[\cos(\alpha-\beta)-\cos(\alpha+\beta)] \quad (7)$$

$$Y(t) = A\cos(\omega_c t(\mp)\phi(t)) \quad (8)$$

Equation 4 shows that the transmission signal Y(t) includes a plurality of harmonics, notably a third harmonic $\cos(3\omega_c (\mp)\omega_m)$t, in addition to the fundamental wave $\cos(\omega_c\pm\omega_m)\cdot$t. As appears from the equations 1 and 2, the harmonics in the transmission signal Y(t) are caused by the harmonics in the oscillation signals $X_{LOI}$ and $X_{LOQ}$. FIG. 8 shows a diagram illustrating the amplitudes of the individual harmonics in relation to an amplitude of the fundamental wave that has been normalized to 1. It appears that the third harmonic has the highest amplitude of all harmonics, the absolute value of its amplitude amounting to one third of the amplitude of the fundamental wave; this means that it has been attenuated by only 9.54 dB with respect thereto.

Because the transmission signal Y(t) includes not only the fundamental wave but also the harmonics, it is uncompensated to this extent. The harmonics in the transmission signal are undesirable and were eliminated thus far by low-pass filtering at a later stage. For specific applications in the field of mobile radio, however, attenuation of the third harmonic at the output of the addition device 54 by 40 dB is necessary; this can be achieved only by means of a substantial amount of filter means. A filter that is suitable for this purpose can thus far be realized only as an external circuit for an integrated transmitter. Therefore, integration of the modulation device and the filter on one chip was not possible thus far.

SUMMARY OF THE INVENTION

On the basis of this state of the art it is an object of the present invention to improve a transmitter and a method of the kind set forth in such a manner that the expenditure for filtering of the transmission signal at a later stage is reduced.

This object is achieved as disclosed in claim 1 as well as by the method disclosed in claim 9.

For the transmitter of the kind set forth this object is achieved in conformity with claim 1 in that there are also provided a second modulation device for generating a compensation signal, representing essentially the components to be compensated in the uncompensated transmission signal, by modulation of the baseband signal with a suitable auxiliary oscillation signal, and a subtraction device for subtracting the compensation signal from the uncompensated transmission signal and for delivering an at least partly compensated transmission signal.

A transmitter thus constructed offers the advantage that undesirable harmonic components in the generated transmission signal are at least partly compensated. The compensation can become manifest, for example, as a significant reduction of the amplitude of individual harmonic components. The expenditure required for a filter that succeeds the transmitter and serves to attenuate further harmonic components still present in the at least partly compensated transmission signal is then substantially less than for the uncompensated transmission signal according to the state of the art.

When the compensation according to the invention involves notably the compensation of the dominant harmonics within the transmitter, a downstream filter can even be integrated on one chip together with the transmitter.

According to a first embodiment of the invention it is advantageous to choose the amplitude of the auxiliary oscillation signal to be such that the compensation signal generated on the output of the second modulation device has a desired amplitude.

As an alternative, it is advantageous when the amplitude of the compensation signal can be adapted to a desired level by way of an attenuation device.

The oscillation signal and the auxiliary oscillation signal can be particularly simply generated when use is made of circulating shift registers.

It is particularly advantageous when the compensation signal represents essentially the third harmonic of the uncompensated transmission signal, because this harmonic is dominant over other harmonics when binary oscillation switching signals are used and is most difficult to eliminate in a downstream filter because of the fact that its frequency is so close to the frequency of the fundamental wave.

A low-pass filter succeeding the transmitter can be advantageously used for the attenuation of harmonic components still present in the transmission signal after the compensation.

When n modulators and n−1 addition devices are used each time in the first and the second modulation device, a plurality of n baseband signals can be modulated and used to generate an at least partly compensated transmission signal.

The object is also achieved by means of a method of generating a transmission signal. The advantages of this method correspond to the advantages mentioned thus far for the above transmitter.

BRIEF DESCRIPTION OF THE DRAWING

The application is accompanied by the FIGS. 1 to 8, where.

DESCRIPTION OF THE PREFERRED EMBODIMENTS

Figure 1:
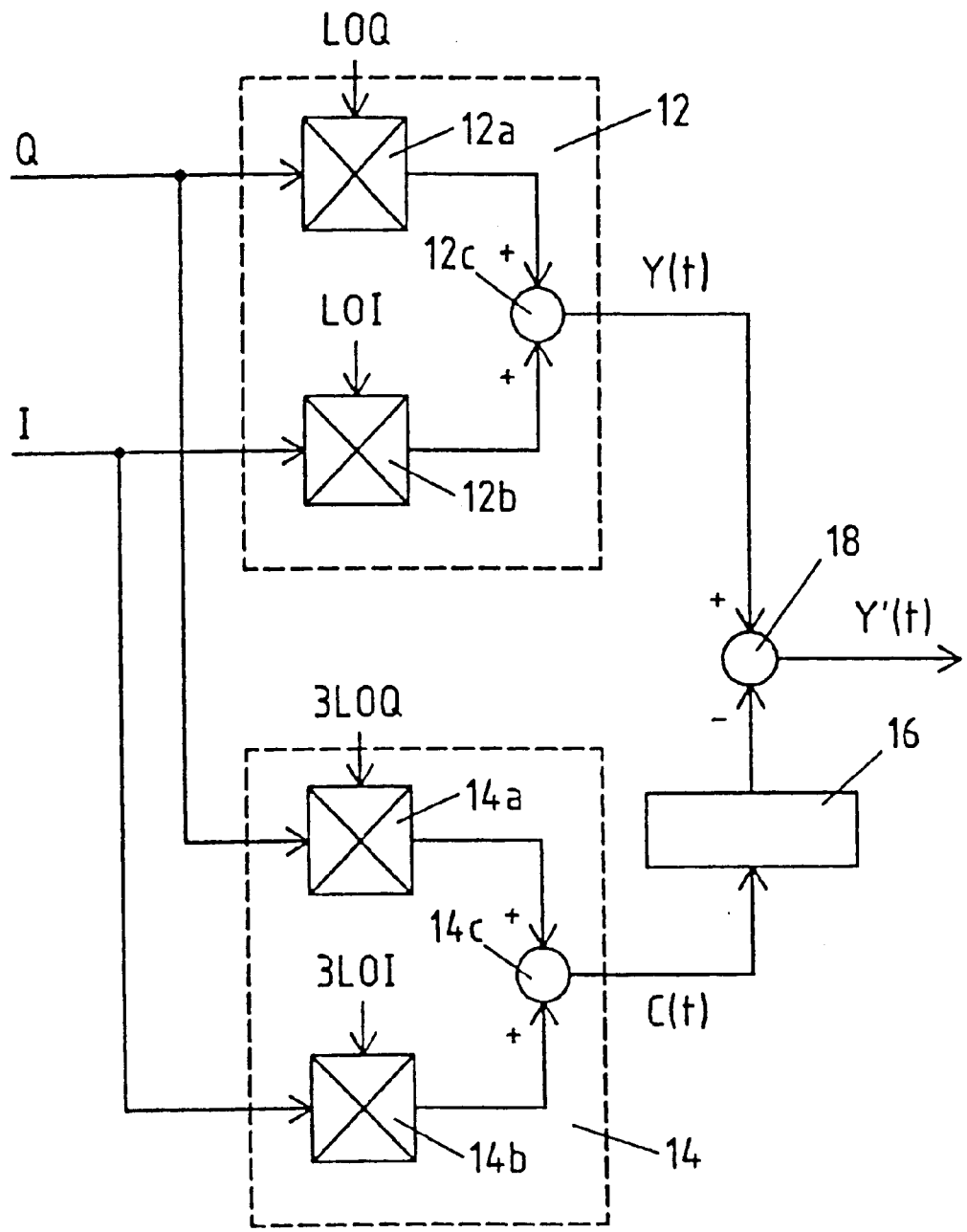
FIG. 1 shows a first embodiment of a transmitter according to the invention.

FIG. 1 shows a transmitter, notably a mobile radio transmitter, for generating an at least partly uncompensated transmission signal Y'(t). The transmitter includes a first modulation device 12 for generating an uncompensated transmission signal Y(t) by modulation of at least one baseband signal I, Q with a respective oscillation signal LOQ, LOI, 3LOQ, 3lOI. The transmitter also includes the second modulation device 14 for generating a compensation signal C(t) which represents essentially the components to be compensated in the uncompensated transmission signal Y(t). The desired compensation signal C(t) is generated by modulation of the baseband signals I, Q applied to the first modulation device 12 with a respective, suitable auxiliary oscillation signal 3LOQ, 3LOI.

The absolute value of the amplitude of the compensation signal C(t) is adapted, in as far as is necessary, to the amplitude of the interference component to be compensated in the uncompensated transmission signal by means of an attenuation device 16 before it is subtracted from the uncompensated transmission signal in a subtraction device 18. The output of the subtraction device 18 presents an at least partly compensated transmission signal Y'(t).

The first and the second modulation device 12, 14 have a construction and mode of operation that correspond to the described quadrature modulator that is known from the present state of the art.

For example, in the transmitter shown in FIG. 1 two baseband signals are modulated in order to generate the uncompensated transmission signal Y(t) and the compensation signal C(t). However, as an alternative version of this example it is also feasible to generate the transmission signal Y(t) and the compensation signal C(t) by respective modulation of n, with n>1. In that case n modulators and n−1 addition devices are required so as to generate the transmission signal Y(t) and the compensation signal C(T).

Figure 2:
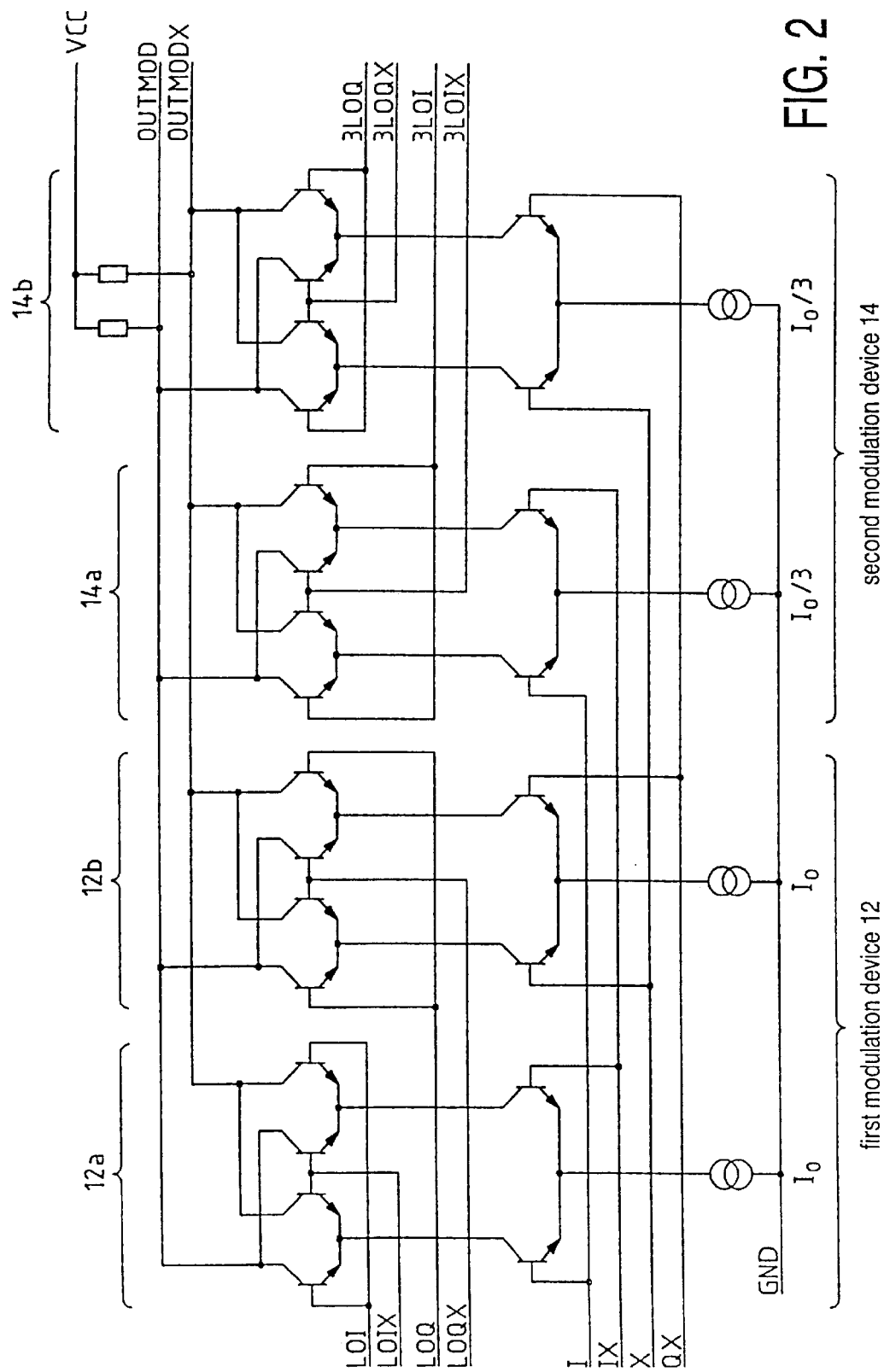
FIG. 2 shows a second embodiment of a transmitter according to the invention.

FIG. 2 shows a second embodiment of the transmitter according to the invention in the form of a transistor circuit. FIG. 2 shows the first and the second modulation device, 12 and 14, each of which includes a respective first and a second modulator 12a, 12b and 14a, 14b, respectively. The two modulation devices 12, 14 correspond to the modulation devices symbolically represented in FIG. 1. The first modulators 12a and 14a receive the baseband signal I and its inverted version IX. The second modulators 12b and 14b receive the baseband Q and its inverted version QX.

The first modulator 12a of the first modulation device 12 receives the oscillations signals LOI and LOIX in order to modulate the baseband signal I and its inverted version IX. The second modulator 12b of the first modulation device 12 receives the oscillation signals LOQ and LOQX for the modulation of the baseband signals Q and the inverse version QX thereof.

In order to generate a first partial component for the compensation signal, the first modulator 14a of the second modulation device 14 receives the auxiliary oscillation signals 3LOI and the inverted version 3LOIX thereof for modulation which each time one of the baseband signals I and IX. The second modulator 14b of the second modulation device 14 operates analogously in that it receives the auxiliary oscillation signals 3LOQ and 3LOQX for modulation with each time one of the baseband signals Q and QX.

All four modulators 12a, 12b, 14a and 14b are fed by individually associated current sources 10. It is to be noted that the modulators of the second modulation device 14 in the example of FIG. 3 receive a current whose absolute value constitutes only a third of the amount of current used to feed the modulators of the first modulation device 12. The amplitude of the compensation signal C(t) of FIG. 1 is thus controlled via the absolute value of the current. The amplitude of the compensation signal is ideally chosen to be such that the attenuation device 16 according to FIG. 1 can be dispensed with. This constitutes the difference between the first and the second embodiment.

The abbreviations OUTMOD and OUTMODX in the circuit shown in FIG. 2 represent the at least partly compensated transmission signal and its inverted version. Furthermore, the abbreviations VCC and GND denote a voltage supply for the circuit and its connection to ground. The circuit shown in FIG. 2 is suitable for integration on a chip. It is also suitable for integration on a chip together with a downstream filter. The filter could serve for the attenuation at a later stage of further interference components still present in the partly compensated transmission signal.

Figure 3:
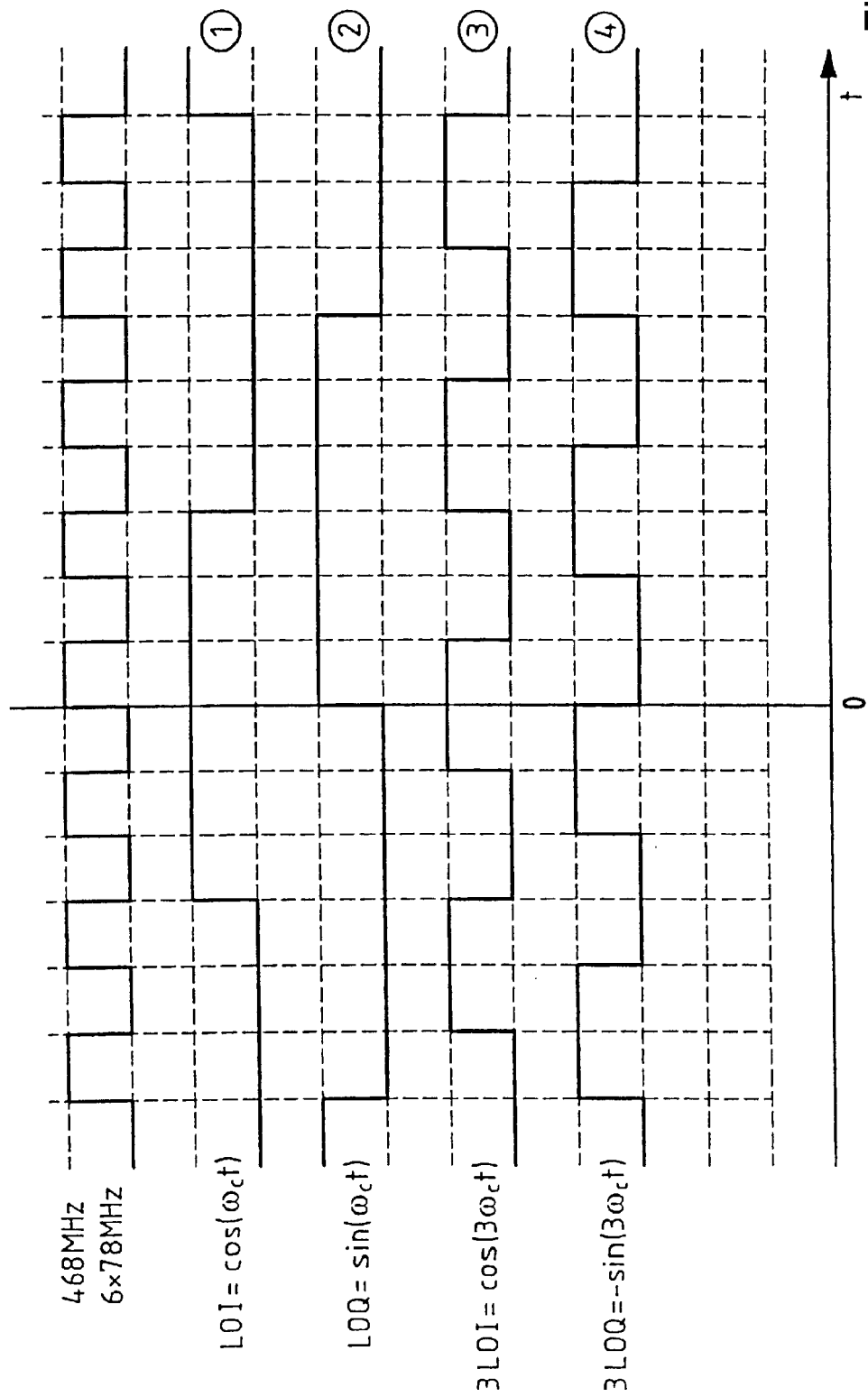
FIG. 3 shows variations of the baseband and oscillation signals for the transmitter according to FIG. 2.

FIG. 3 shows the variations of the oscillation signals LOI and LOQ as well as of the auxiliary oscillation signals 3LOI and 3LOQ. It appears that all of said signals can be derived by frequency division from a predetermined clock signal which has, by way of example, a frequency of 468 MHz in conformity with FIG. 3. In the second embodiment in conformity with the FIGS. 2 and 3 the compensation aims to compensate the third harmonic in the uncompensated transmission signal at the output of the first modulation device 12. To this end, the second modulation device is supplied with auxiliary oscillation signals 3LOI and 3LOQ which represent the third harmonic of the oscillation signals LOI and LOQ, respectively. This can be seen notably in FIG. 3 in that the auxiliary oscillation signals 3LOI and 3LOQ have a frequency amounting to three times the frequency of the associated oscillation signals.

Figure 4:
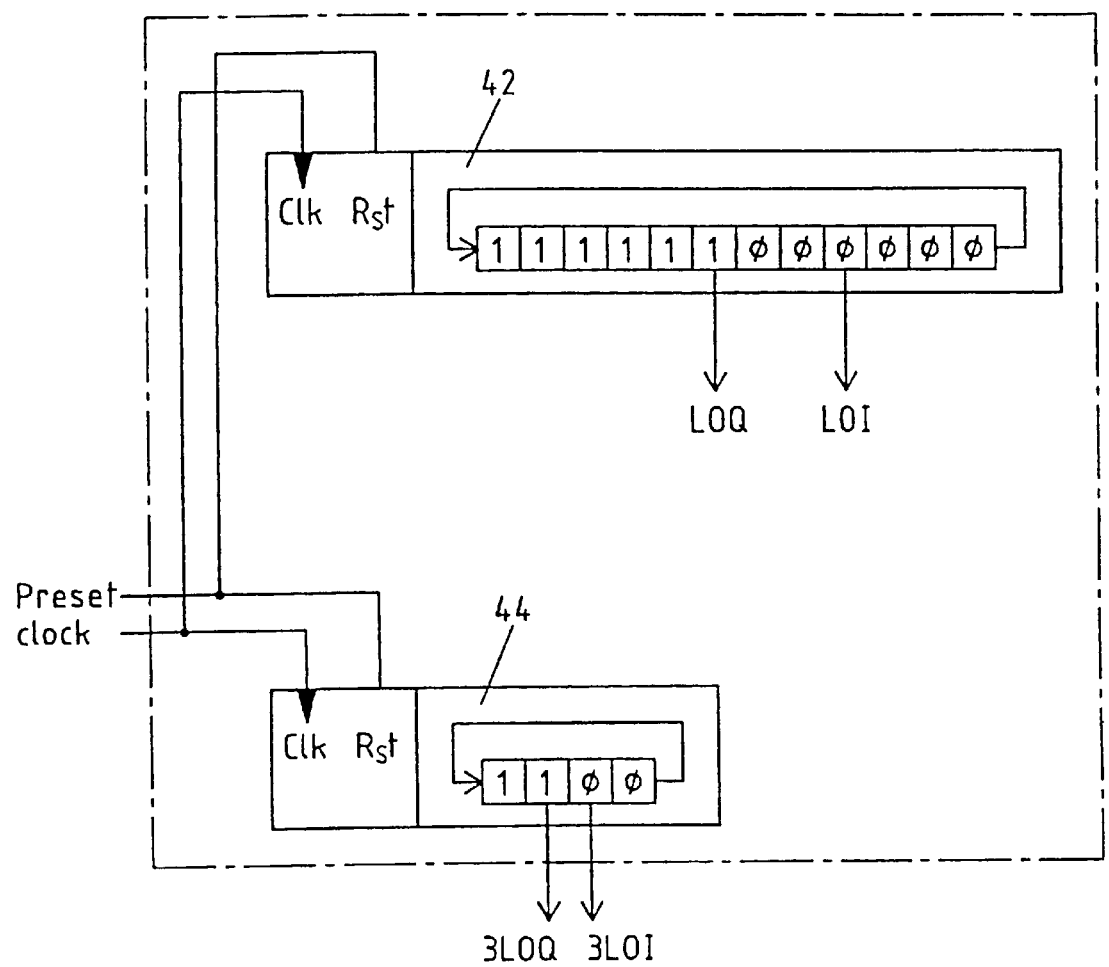
FIG. 4 shows circulating shift registers for generating the oscillation signals and auxiliary oscillation signals.
Figure 5:
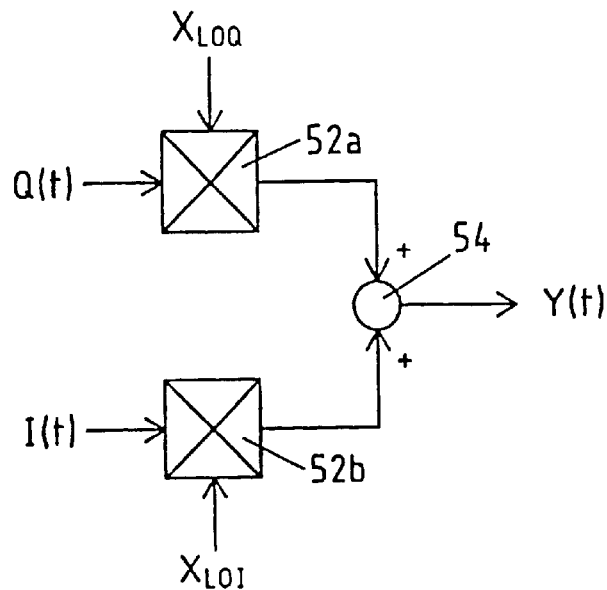
FIG. 5 shows a quadrature modulator according to the present state of the art.
Figure 6:
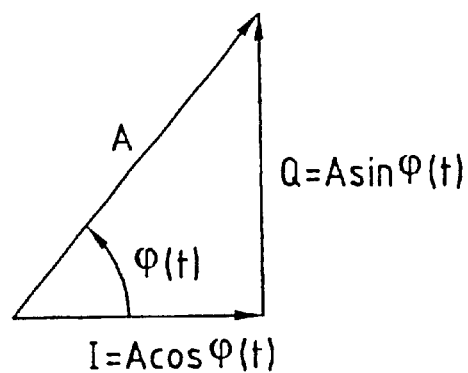
FIG. 6 shows an example of the extraction of baseband signals I, Q in conformity with the present state of the art.
Figure 7:
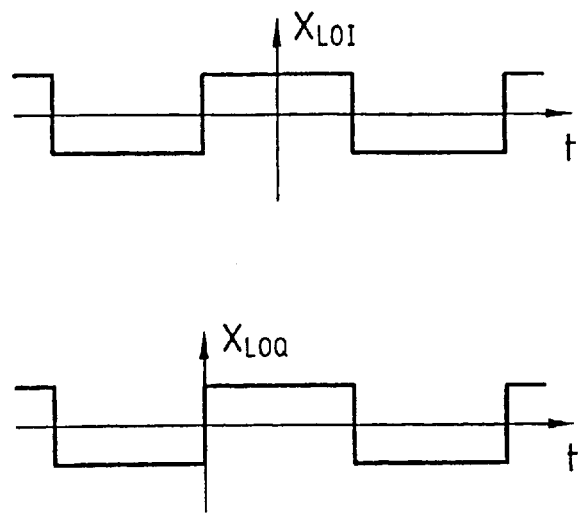
FIG. 7 shows examples of oscillation signals according to the present state of the art.
Figure 8:
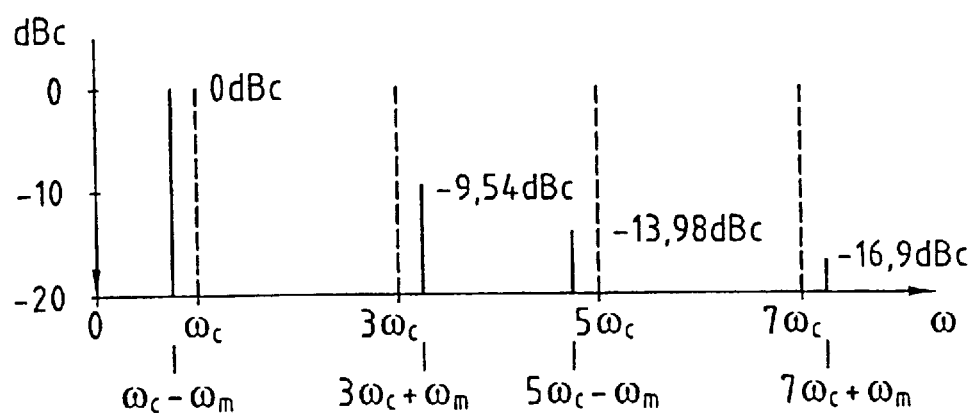
FIG. 8 shows a diagram illustrating the weighting of harmonics in comparison with the fundamental wave in the case of an uncompensated transmission signal.

FIG. 4 shows a simple example of the generating of the oscillation and auxiliary oscillation signals of FIG. 3 from a clock signal by utilizing circulating shift registers 42 and 44. One half of the circulating shift registers 42, 44 is already filled with ones and zeroes. When the clock signal is applied to the two circulating shift registers, the desired oscillation and auxiliary oscillation signals can be simply extracted from appropriate outputs of the circulating shift registers.

What is claimed is:

1. A transmitter for generating a transmission signal Y(t), said transmitter comprising:

a first modulation device (12) for generating an uncompensated transmission signal Y(t) by modulation of at least one baseband signal I, Q with a respective oscillation signal LOQ, LOI; and a second modulation device (14) for generating a compensation signal C(t), representing essentially the components to be compensated in the uncompensated transmission signal Y(t), by modulation of the baseband signal I, Q with an auxiliary oscillation signal 3LOQ, 3LOI, and a subtraction device (18) for subtracting the compensation signal C(t) from the uncompensated transmission signal Y(t) and for delivering an at least partly compensated transmission signal Y'(t).

2. A transmitter as claimed in claim 1, characterized in that the amplitude of the auxiliary oscillation signal 3LOQ, 3LOI is chosen to be such that the amplitude of the compensation signal C(t) at the output of the second modulation device (14) corresponds to the amplitude of the component to be compensated in the uncompensated transmission signal Y(t).

3. A transmitter as claimed in claim 1, characterized in that the transmitter includes an attenuation device (16) which succeeds the second modulation device (14) and adapts the amplitude of the compensation signal, before the compensation signal C(t) is applied to the subtraction device (18), to the amplitude of the component to be compensated in the uncompensated transmission signal Y(t).

4. A transmitter as claimed in claim 1, characterized in that the transmitter includes a first circulating shift register (42) for generating the oscillation signals LOQ or LOI and/or a second circulating shift register for generating the auxiliary oscillation signals 3LOQ or 3LOI.

5. A transmitter as claimed in claim 1, characterized in that the compensation signal C(t) represents essentially the third harmonic of the uncompensated transmission signal Y(t).

6. A transmitter as claimed in claim 1, characterized in that the transmitter includes a low-pass filter which succeeds the subtraction device (18) and serves to remove further undesirable components that are still present in the partly compensated transmission signal Y'(t).

7. A transmitter as claimed in claim 1, characterized in that the first modulation device (12) includes:

n modulators (12a, 12b) for generating n intermediate signals by modulation of each time one of n baseband signals I, Q with a respective modulation signal LOQ, LOI, and n−1 addition devices (12c) for generating the uncompensated transmission signal Y(t) by addition of the intermediate signals.

8. A transmitter (14a, 14b) as claimed in claim 1, characterized in that the second modulation device (14) includes:

n modulators for generating n intermediate compensation signals by modulating each time one of the n baseband signals I, Q with a respective auxiliary oscillation signal 3LOQ, 3LOI, and n−1 addition devices (14c) for generating the compensation signal by addition of the intermediate compensation signals.

9. A method of generating a transmission signal y'(t) which includes the following steps:

generating an uncompensated transmission signal y(t) by modulating at least one baseband signal I, Q with a respective oscillation signal LOQ, LOI, characterized in that a compensation signal C(t) is generated by modulating the baseband signal I, Q with an auxiliary oscillation signal 3LOQ, 3LOI, the compensation signal representing essentially the components to be compensated in the uncompensated transmission signal Y(t), and the compensation signal C(t) being subtracted from the uncompensated transmission signal Y(t) in order to generate an at least partly compensated transmission signal Y'(t).

* * * * *